United States Patent
Haishi et al.

(10) Patent No.: US 11,844,201 B2
(45) Date of Patent: Dec. 12, 2023

(54) RADIO WAVE ABSORBER AND LAMINATE FOR RADIO WAVE ABSORBERS

(71) Applicant: NITTO DENKO CORPORATION, Ibaraki (JP)

(72) Inventors: Motoki Haishi, Osaka (JP); Kazuto Yamagata, Osaka (JP); Hironobu Machinaga, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 500 days.

(21) Appl. No.: 17/276,550

(22) PCT Filed: Sep. 20, 2019

(86) PCT No.: PCT/JP2019/037114
§ 371 (c)(1),
(2) Date: Mar. 16, 2021

(87) PCT Pub. No.: WO2020/066945
PCT Pub. Date: Apr. 2, 2020

(65) Prior Publication Data
US 2022/0039302 A1 Feb. 3, 2022

(30) Foreign Application Priority Data
Sep. 26, 2018 (JP) .................... 2018-179755

(51) Int. Cl.
*H05K 9/00* (2006.01)
*B32B 27/08* (2006.01)
*H01Q 17/00* (2006.01)

(52) U.S. Cl.
CPC ............ *H05K 9/0084* (2013.01); *B32B 27/08* (2013.01); *B32B 2255/02* (2013.01);
(Continued)

(58) Field of Classification Search
CPC ............... H05K 9/0084; H05K 9/0075; B32B 2307/204; B32B 2255/205;
(Continued)

(56) References Cited

U.S. PATENT DOCUMENTS

| 2018/0319138 A1 | 11/2018 | Ukei et al. |
| 2018/0332742 A1 | 11/2018 | Yamagata et al. |

(Continued)

FOREIGN PATENT DOCUMENTS

| JP | 2017-112373 A | 6/2017 |
| WO | 2018/230092 A1 | 12/2018 |

OTHER PUBLICATIONS

International Search Report dated Dec. 3, 2019, issued in counterpart application No. PCT/JP2019/037114 (2 pages).

*Primary Examiner* — Timothy X Pham
(74) *Attorney, Agent, or Firm* — WHDA, LLP (57) ABSTRACT

A radio wave absorber (1a) includes a resistive layer (20), an electrical conductor (30), and a dielectric layer (10). The resistive layer (20) includes indium tin oxide as a main component. The electrical conductor (30) reflects a radio wave. The dielectric layer (10) is disposed between the resistive layer (20) and the electrical conductor (30) in the thickness direction of the resistive layer (20). The dielectric layer (10) is formed of a polymer. The content of tin oxide in the indium tin oxide included in the resistive layer (20) is more than 0 weight % and less than 20 weight %. The number of hydrogen atoms included in the resistive layer (20) is 5% or more of the total number of indium atoms, tin atoms, oxygen atoms, and hydrogen atoms included in the resistive layer (20).

14 Claims, 2 Drawing Sheets

(52) U.S. Cl.
CPC ....... *B32B 2255/10* (2013.01); *B32B 2307/20* (2013.01); *H01Q 17/00* (2013.01)

(58) Field of Classification Search
CPC .... B32B 2255/26; H01Q 17/00; H01Q 15/14; H01Q 15/0013; H01Q 17/007; H01Q 1/526; H01Q 15/0026; H01Q 17/008; H01Q 19/10; C23C 14/086
See application file for complete search history.

(56) References Cited

U.S. PATENT DOCUMENTS

2020/0214181 A1    7/2020  Yamagata et al.
2021/0265738 A1*   8/2021  Mutou ................. H05K 9/0084

\* cited by examiner

RADIO WAVE ABSORBER AND LAMINATE FOR RADIO WAVE ABSORBERS

TECHNICAL FIELD

The present invention relates to a radio wave absorber and a laminate for radio wave absorbers.

BACKGROUND ART

Radio wave absorbers for preventing radio interference have been known.

For example, Patent Literature 1 describes an electromagnetic wave absorber including a dielectric layer composed of a polymer film, a resistive layer including indium tin oxide as its main component and disposed on one surface of the dielectric layer, and an electrical conductor having a sheet resistance lower than that of the resistive layer and disposed on the other surface of the dielectric layer. In this electromagnetic wave absorber, the content of tin oxide included in the indium tin oxide in the resistive layer is 20 to 40 weight %. Consequently, the resistive layer has an extremely stable amorphous structure, a time-dependent or environment-dependent variation in the sheet resistance of the resistive layer can be reduced, and the electromagnetic wave absorption effect is exhibited over a long period of time.

CITATION LIST

Patent Literature

Patent Literature 1: JP 2017-112373 A

SUMMARY OF INVENTION

Technical Problem

Patent Literature 1 does not describe a technique that allows exhibition of desired radio wave absorption performance after long-term exposure to a high-temperature and high-humidity environment when the content of tin oxide in the indium tin oxide in the resistive layer is less than 20 weight %.

In view of such circumstances, the present invention provides a radio wave absorber in which the content of tin oxide in indium tin oxide in a resistive layer is less than 20 weight % but which is advantageous in terms of exhibiting desired radio wave absorption performance after long-term exposure to a high-temperature and high-humidity environment.

Solution to Problem

The present invention provides a radio wave absorber, including:
a resistive layer including indium tin oxide as a main component;
an electrical conductor that reflects a radio wave; and
a dielectric layer disposed between the resistive layer and the electrical conductor in the thickness direction of the resistive layer and formed of a polymer, wherein
the content of tin oxide in the indium tin oxide is more than 0 weight % and less than 20 weight %, and
the number of hydrogen atoms included in the resistive layer is 5% or more of the total number of indium atoms, tin atoms, oxygen atoms, and hydrogen atoms included in the resistive layer.

Advantageous Effects of Invention

The above radio wave absorber is advantageous in terms of exhibiting desired radio wave absorption performance after long-term exposure to a high-temperature and high-humidity environment.

DESCRIPTION OF EMBODIMENTS

Hereinafter, embodiments of the present invention will be described with reference to the drawings. The present invention is not limited to the following embodiments.

Figure 1A:
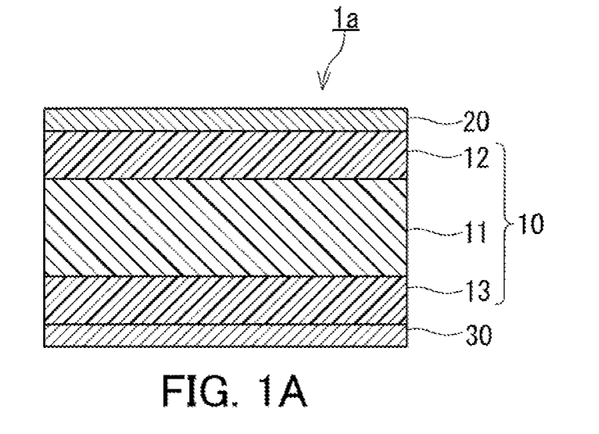
FIG. 1A is a cross-sectional view showing an example of the radio wave absorber according to the present invention.

As shown in FIG. 1A, a radio wave absorber 1a includes a resistive layer 20, an electrical conductor 30, and a dielectric layer 10. The resistive layer 20 includes indium tin oxide as a main component. The term "main component" as used herein refers to a component whose content is highest on a mass basis. The electrical conductor 30 reflects a radio wave. The dielectric layer 10 is disposed between the resistive layer 20 and the electrical conductor 30 in the thickness direction of the resistive layer 20. The dielectric layer 10 is formed of a polymer. The resistive layer 20 satisfies the following requirements (I) and (II).

(I) The content of tin oxide in the indium tin oxide included in the resistive layer 20 is more than 0 weight % and less than 20 weight %.

(II) The number of hydrogen atoms included in the resistive layer 20 is 5% or more of the total number of indium atoms, tin atoms, oxygen atoms, and hydrogen atoms included in the resistive layer 20.

The radio wave absorber 1a is a λ/4 radio wave absorber. The radio wave absorber 1a is designed to cause interference between a radio wave reflected by the surface of the resistive layer 20 (front surface reflection) and a radio wave reflected by the electrical conductor 30 (back surface reflection) upon incidence of a radio wave having a wavelength ($\lambda_O$) to be absorbed on the radio wave absorber 1a. In the λ/4 radio wave absorber, the wavelength ($\lambda_O$) of a radio wave to be absorbed is determined according to the thickness (t) of the dielectric layer and the relative permittivity ($\varepsilon_r$) of the dielectric layer, as shown in the following equation (1). That is, a radio wave having a wavelength to be absorbed can be set by appropriately adjusting the relative permittivity and thickness of the dielectric layer. In the equation (1), sqrt($\varepsilon_r$) means a square root of the relative permittivity $\varepsilon_r$.

$$\lambda_O = 4t \times \text{sqrt}(\varepsilon_r) \quad \text{Equation (1)}$$

Since the radio wave absorber 1a includes the above-described resistive layer 20, the radio wave absorber 1a is likely to exhibit desired radio wave absorption performance after long-term exposure to a high-temperature and high-humidity environment. Through a lot of trial and error, the present inventors newly found that when the content of tin oxide in indium tin oxide included in a resistive layer as a main component is less than 20 weight %, an increase in the concentration of hydrogen atoms in the resistive layer to the given value or more allows a radio wave absorber to exhibit desired radio wave absorption performance after long-term exposure to a high-temperature and high-humidity environment.

In the resistive layer 20, the content of tin oxide in the indium tin oxide may be, for example, 1 weight % or more, 2 weight % or more, or 3 weight % or more.

The number of hydrogen atoms included in the resistive layer 20 may be 5 to 15% of the total number of indium atoms, tin atoms, oxygen atoms, and hydrogen atoms included in the resistive layer 20.

The resistive layer 20 is typically in an amorphous state. The resistive layer 20 is likely to stably maintain its amorphous state. This is thought to make it likely that the radio wave absorber 1a exhibits desired radio wave absorption performance after long-term exposure to a high-temperature and high-humidity environment.

The radio wave absorber 1a can exhibit, for example, a return loss of 10 dB or more for a vertically incident radio wave having a wavelength to be absorbed after the environment around the radio wave absorber 1a has been maintained at a temperature of 85° C. and a relative humidity of 85% for 500 hours. The return loss can be measured, for example, according to Japanese Industrial Standards (JIS) R 1679: 2007.

The resistive layer 20 remains in an amorphous state, for example, after the resistive layer 20 is subjected to annealing at 150° C. and for 1 hour. In this case, the radio wave absorber 1a is likely to exhibit desired radio wave absorption performance more reliably after long-term exposure to a high-temperature and high-humidity environment. If a resistive layer including indium tin oxide in which the content of tin oxide is less than 20 weight % as its main component and not satisfying the above requirement (II) is, for example, subjected to annealing treatment at 150° C. for 1 hour after formation of the layer, the resistive layer turns into a film including a crystallized portion. In this case, the resistive layer can have an extremely low sheet resistance, and the resulting radio wave absorber can have a low radio wave absorption performance.

The resistive layer 20 may include at least one selected from the group consisting of silicon oxide, magnesium oxide, and zinc oxide. In this case as well, the state of the resistive layer 20 can be stably maintained, and the radio wave absorber 1a is likely to exhibit desired radio wave absorption performance more reliably after long-term exposure to a high-temperature and high-humidity environment.

The resistive layer 20 has a sheet resistance of, for example, 180 to 600Ω/□. In this case, the radio wave absorber 1a is likely to exhibit desired radio wave absorption performance. In designing the λ/4 radio wave absorber, the sheet resistance of the resistive layer 20 is determined so that an impedance expected on a front surface of the resistive layer 20 based on the transmission-line theory will be equal to a characteristic impedance. The sheet resistance required of the resistive layer 20 can change according to a possible incident angle at which a radio wave is incident on the λ/4 radio wave absorber. The sheet resistance of the resistive layer 20 may be 190 to 580Ω/□ or 200 to 550Ω/□. The term "the sheet resistance of the resistive layer 20" refers to an initial sheet resistance, unless otherwise described.

The thickness of the resistive layer 20 is not particularly limited. The resistive layer 20 has a thickness of, for example, 18 to 100 nm. In this case, the resistive layer 20 is likely to have the desired sheet resistance, and the resistive layer 20 is likely to have the desired properties after long-term exposure of the radio wave absorber 1a to a high-temperature and high-humidity environment. The resistive layer 20 desirably has a thickness of 20 to 100 nm. The specific resistance of the material of the resistive layer 20 is adjusted so that the resistive layer 20 having a thickness in the above range will have the desired sheet resistance. The specific resistance of the material of the resistive layer 20 is, for example, $5.4 \times 10^{-4}$ to $5.0 \times 10^{-3}$ Ω·cm.

The resistive layer 20 has a Hall mobility of, for example, less than 40 cm$^2$/(V·s). In this case, the radio wave absorber 1a is likely to exhibit desired radio wave absorption performance more reliably after long-term exposure to a high-temperature and high-humidity environment. The Hall effect of the resistive layer 20 is measured, for example, according to the van der Pauw method.

The electrical conductor 30 is not particularly limited as long as the electrical conductor 30 can reflect a radio wave to be absorbed. The electrical conductor 30 has a given electrical conductivity. As shown in FIG. 1A, the electrical conductor 30 is formed, for example, in the form of a layer. In this case, the electrical conductor 30 has a lower sheet resistance than that of the resistive layer 20. The electrical conductor 30 may be in a form other than a layer.

The electrical conductor 30 includes, for example, indium tin oxide. In this case, the electrical conductor 30 is likely to have high transparency.

The content of tin oxide in the indium tin oxide in the electrical conductor 30 is, for example, 5 to 15 weight %. In this case, the electrical conductor 30 can be formed of indium tin oxide in a stable polycrystalline state by annealing treatment. Consequently, the radio wave absorber 1a is likely to exhibit desired radio wave absorption performance more reliably after long-term exposure to a high-temperature and high-humidity environment.

The electrical conductor 30 may include at least one selected from the group consisting of aluminum, copper, an aluminum alloy, and a copper alloy. In this case, a desired electrical conductivity is likely to be achieved while the thickness of the electrical conductor 30 is reduced.

The thickness of the electrical conductor 30 is not limited to a particular thickness. For example, when the electrical conductor 30 is in the form of a layer, the electrical conductor 30 has a thickness of, for example, 20 to 200 nm and desirably 50 to 150 nm. In this case, the radio wave absorber 1a can exhibit desired radio wave absorption performance, and cracking of the electrical conductor 30 is less likely to occur.

The dielectric layer 10 has a relative permittivity of, for example, 2.0 to 20.0. In this case, the thickness of the dielectric layer 10 is easily adjusted and the radio wave absorption performance of the radio wave absorber 1a is easily adjusted. The relative permittivity of the dielectric layer 10 is, for example, the relative permittivity at 10 GHz measured by a cavity resonance method.

The polymer forming the dielectric layer 10 is not limited to a particular polymer. The dielectric layer 10 includes, for example, at least one polymer selected from the group consisting of ethylene-vinyl acetate copolymer, vinyl chloride resin, urethane resin, acrylic resin, acrylic urethane resin, polyethylene, silicone, and polyethylene terephthalate. In this case, the thickness of the dielectric layer 10 is easily adjusted, and the manufacturing cost of the radio wave absorber 1a can be maintained at a low level. The dielectric layer 10 can be produced, for example, by hot-pressing a given resin composition.

The dielectric layer 10 may be formed as a single layer or of a plurality of layers made of the same material or different materials. When the dielectric layer 10 includes n layers (n is an integer of 2 or greater), the relative permittivity of the dielectric layer 10 is determined, for example, as follows. The relative permittivity $\varepsilon_i$ of each layer is measured (i is an integer of 1 to n). Then, the relative permittivity $\varepsilon_i$ of each layer is multiplied by the proportion of the thickness $t_i$ of the layer in the total thickness T of the dielectric layer 10 to determine $\varepsilon_i \times (t_i/T)$. The relative permittivity of the dielectric layer 10 can be determined by adding the $\varepsilon_i \times (t_i/T)$ values of all layers.

As shown in FIG. 1A, the dielectric layer 10 includes, for example, a first layer 11, a second layer 12, and a third layer 13. The first layer 11 is disposed between the second layer 12 and the third layer 13. The first layer 11 includes, for example, at least one polymer selected from the group consisting of ethylene-vinyl acetate copolymer, vinyl chloride resin, urethane resin, acrylic resin, acrylic urethane resin, polyethylene, silicone, and polyethylene terephthalate.

The second layer 12, for example, serves as a support supporting the resistive layer 20. In this case, the resistive layer 20 is formed, for example, by forming a film on the second layer 12 by sputtering using a given target material. In this case, the resistive layer 20 satisfying the above requirement (I) can be formed, for example, by using a target material including indium tin oxide as its main component and adjusting the content of $SnO_2$ in the target material. Moreover, the resistive layer 20 satisfying the above requirement (II) can be formed by adjusting the water content in the second layer 12 or the amount of water supplied around the second layer 12 during the sputtering. In some cases, the resistive layer 20 may be formed by forming a film by a method such as ion plating or coating (for example, bar coating).

Figure 1B:
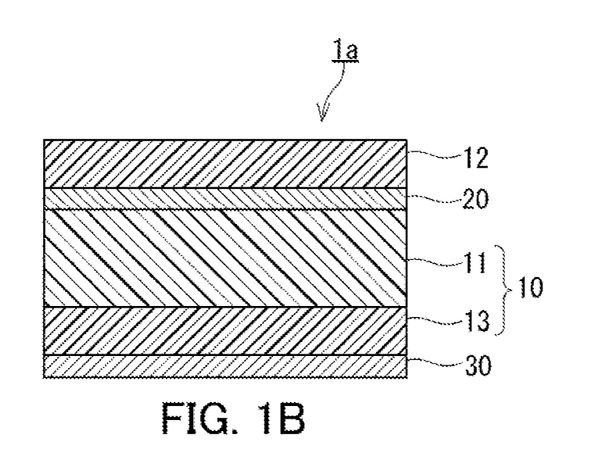
FIG. 1B is a cross-sectional view showing a variation of the radio wave absorber shown in FIG. 1A.

In the radio wave absorber 1a, the second layer 12 is, for example, disposed closer to the electrical conductor 30 than the resistive layer 20 is and constitutes a portion of the dielectric layer 10. As shown in FIG. 1B, the second layer 12 may be disposed farther from the electrical conductor 30 than the resistive layer 20 is. In this case, the second layer 12 protects the resistive layer 20 and the dielectric layer 10, and the radio wave absorber 1a has high durability. In this case, for example, the resistive layer 20 may be in contact with the first layer 11. The second layer 12, for example, also serves as an auxiliary member for adjusting the thickness of the resistive layer 20 with high accuracy. The material of the second layer 12 is, for example, polyethylene terephthalate (PET), polyethylene naphthalate (PEN), acrylic resin (PMMA), polycarbonate (PC), or cycloolefin polymer (COP). Among these, the material of the second layer 12 is desirably PET in terms of the balance among good heat-resistance, the dimensional stability, and manufacturing cost.

The second layer 12 has a thickness of, for example, 10 to 150 μm and desirably 15 to 100 μm. In this case, the second layer 12 has low flexural rigidity, and occurrence of a wrinkle in the second layer 12 or deformation of the second layer 12 can be reduced at the time of formation of the resistive layer 20.

Figure 1C:
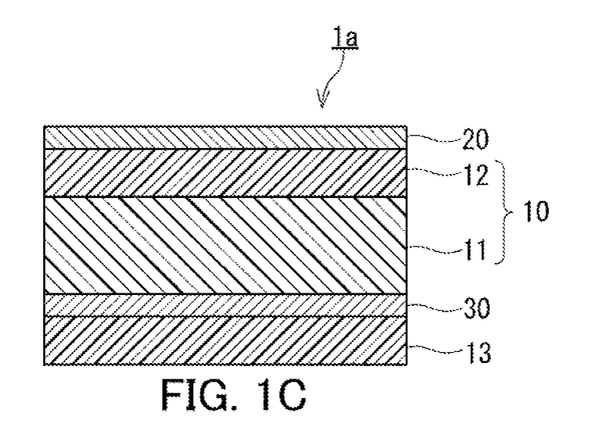
FIG. 1C is a cross-sectional view showing another variation of the radio wave absorber shown in FIG. 1A.

In the radio wave absorber 1a, the third layer 13 supports, for example, the electrical conductor 30 in the form of a layer. In this case, the electrical conductor 30 in the form of a layer can be produced, for example, by forming a film on the third layer 13 by a method such as sputtering, ion plating, or coating (for example, bar coating). In the radio wave absorber 1a, for example, the third layer 13 is disposed closer to the resistive layer 20 than the electrical conductor 30 in the form of a layer is and constitutes a portion of the dielectric layer 10. As shown in FIG. 1C, the third layer 13 may be disposed farther from the resistive layer 20 than the electrical conductor 30 in the form of a layer is. In this case, for example, the electrical conductor 30 in the form of a layer is in contact with the first layer 11.

The examples of the material of the second layer 12, for example, can be used as the material of the third layer 13. The material of the third layer 13 may be the same or different from the material of the second layer 12. The material of the third layer 13 is desirably PET in terms of the balance among good heat-resistance, the dimensional stability, and manufacturing cost.

The third layer 13 has a thickness of, for example, 10 to 150 μm and desirably 15 to 100 μm. In this case, the third layer 13 has low flexural rigidity, and occurrence of a wrinkle in the third layer 13 or deformation of the third layer 13 can be reduced at the time of formation of the electrical conductor 30 in the form of a layer. The third layer 13 can be omitted in some cases.

The first layer 11 may be composed of a plurality of layers. The first layer 11 can be composed of a plurality of layers particularly when the first layer 11 is in contact with at least one of the resistive layer 20 and the electrical conductor 30 in the form of a layer, as shown in FIG. 1B and FIG. 1C.

The radio wave absorber 1a is designed to absorb a radio wave having a desired wavelength. The type of a radio wave the radio wave absorber 1a can absorb is not particularly limited. A radio wave the radio wave absorber 1a can absorb can be, for example, a millimeter or submillimeter wave in a particular frequency range.

The radio wave absorber 1a can be modified in various respects. For example, the radio wave absorber 1a may be modified to a radio wave absorber 1b shown in FIG. 2, a radio wave absorber 1c shown in FIG. 3, or a radio wave absorber 1d shown in FIG. 4. The radio wave absorbers 1b, 1c, and 1d are configured in the same manner as the radio wave absorber 1a unless otherwise described. The components of the radio wave absorbers 1b, 1c, and 1d that are the same as or correspond to the components of the radio wave absorber 1a are denoted by the same reference characters, and detailed descriptions of such components are omitted. The description given for the radio wave absorber 1a is applicable to the radio wave absorbers 1b, 1c, and 1d unless there is a technical inconsistency.

Figure 2:
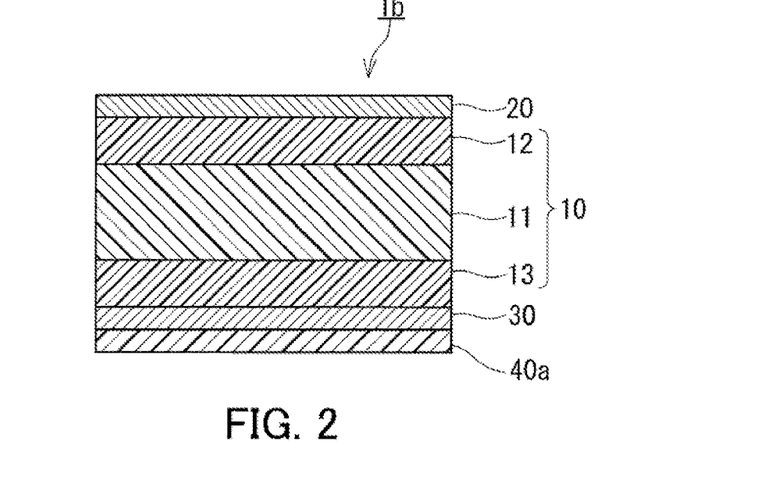
FIG. 2 is a cross-sectional view showing another example of the radio wave absorber according to the present invention.

As shown in FIG. 2, the radio wave absorber 1b further includes an adhesive layer 40a. In the radio wave absorber 1b, the electrical conductor 30 is disposed between the dielectric layer 10 and the adhesive layer 40a.

For example, the radio wave absorber 1b can be attached to a given article by bringing the adhesive layer 40a into contact with the article and pressing the radio wave absorber 1b to the article. A radio wave absorber-attached article can be obtained in this manner.

The adhesive layer 40a includes, for example, a rubber pressure-sensitive adhesive, an acrylic pressure-sensitive adhesive, a silicone pressure-sensitive adhesive, or a urethane pressure-sensitive adhesive. The radio wave absorber 1b may further include a separator. In this case, the separator covers the adhesive layer 40a. The separator is typically a film capable of maintaining the adhesiveness of the adhesive layer 40a while covering the adhesive layer 40a, the film being easily removable from the adhesive layer 40a. The separator is, for example, a film made of a polyester resin such as polyethylene terephthalate (PET). Removal of the separator exposes the adhesive layer 40a and makes it possible to attach the radio wave absorber 1b to an article.

Figure 3:
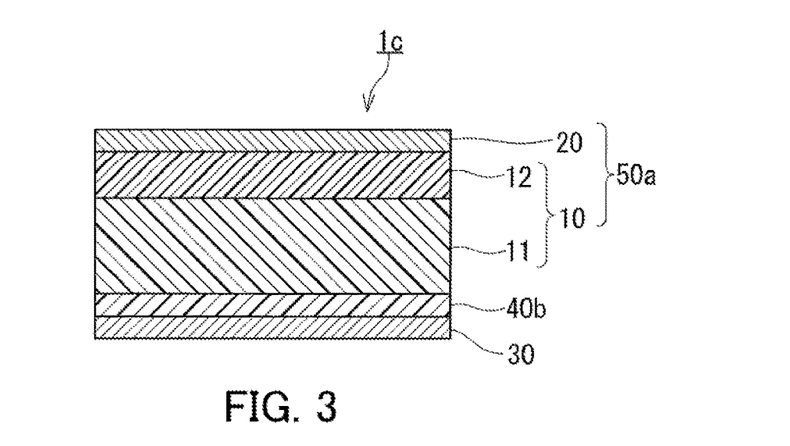
FIG. 3 is a cross-sectional view showing yet another example of the radio wave absorber according to the present invention.

As shown in FIG. 3, the radio wave absorber 1c further includes an adhesive layer 40b. The adhesive layer 40b is disposed between the dielectric layer 10 and the electrical conductor 30. The radio wave absorber 1c includes a laminate 50a for radio wave absorbers that includes the resistive layer 20 and the dielectric layer 10. The adhesive layer 40b is, for example, formed in contact with the dielectric layer 10. In the laminate 50a for radio wave absorbers, the dielectric layer 10 is disposed in contact with the resistive layer 20. For example, the radio wave absorber 1c can be produced by bringing the adhesive layer 40b into contact with the electrical conductor 30 and pressing the laminate 50a for radio wave absorbers to the electrical conductor 30 to attach the laminate 50a for radio wave absorbers to the electrical conductor 30. The adhesive layer 40b includes, for example, a rubber pressure-sensitive adhesive, an acrylic pressure-sensitive adhesive, a silicone pressure-sensitive adhesive, or a urethane pressure-sensitive adhesive.

The laminate 50a for radio wave absorbers may further include a separator. In this case, the separator covers the adhesive layer 40b. The separator is typically a film capable of maintaining the adhesiveness of the adhesive layer 40b while covering the adhesive layer 40b, the film being easily removable from the adhesive layer 40b. The separator is, for example, a film made of a polyester resin such as polyethylene terephthalate (PET). Removal of the separator exposes the adhesive layer 40b and makes it possible to attach the laminate 50a for radio wave absorbers to the electrical conductor 30.

In the electromagnetic wave absorber 1c, the first layer 11 may be composed of a plurality of layers. The first layer 11 can be composed of a plurality of layers particularly when the first layer 11 is in contact with the resistive layer 20.

Figure 4:
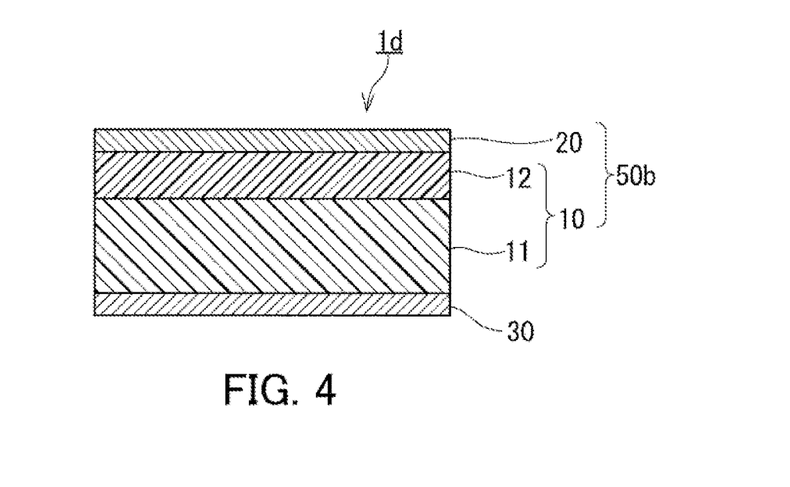
FIG. 4 is a cross-sectional view showing yet another example of the radio wave absorber according to the present invention.

As shown in FIG. 4, in the radio wave absorber 1d, the dielectric layer 10 adheres to the electrical conductor 30. In other words, a surface of the dielectric layer 10, the surface to be in contact with the electrical conductor 30, has adhesiveness to the electrical conductor. The radio wave absorber 1d includes a laminate 50b for radio wave absorbers that includes the resistive layer 20 and the dielectric layer 10. In the laminate 50b for radio wave absorbers, the dielectric layer 10 is disposed in contact with the resistive layer 20. For example, the radio wave absorber 1d can be produced by bringing the dielectric layer 10 into contact with the electrical conductor 30 and pressing the laminate 50b for radio wave absorbers to the electrical conductor 30 to attach the laminate 50b for radio wave absorbers to the electrical conductor 30.

The laminate 50b for radio wave absorbers may further include a separator. In this case, the separator covers the surface of the dielectric layer 10 to be in contact with the electrical conductor 30. The separator is typically a film capable of maintaining the adhesiveness of the surface of the dielectric layer 10 to be in contact with the electrical conductor 30 while covering the surface, the film being easily removable from the dielectric layer 10. The separator is, for example, a film made of a polyester resin such as polyethylene terephthalate (PET). Removal of the separator exposes the surface of the dielectric layer 10 to be in contact with the electrical conductor 30 and makes it possible to attach the laminate 50b for radio wave absorbers to the electrical conductor 30.

In the electromagnetic wave absorber 1d, the first layer 11 may be composed of a plurality of layers. The first layer 11 can be composed of a plurality of layers particularly when the first layer 11 is in contact with the resistive layer 20.

EXAMPLES

The present invention will be described in more detail by examples. The present invention is not limited to the examples given below. First, methods for evaluation of Examples and Comparative Example will be described.

[Concentration of Hydrogen Atoms]

High-resolution Rutherford backscattering spectroscopy (RBS) was performed for specimens made from resistive layer-attached films of Examples and Comparative Example using a high-resolution Rutherford backscattering spectrometer (manufactured by Kobe Steel, Ltd., product name: HRBS500). A PET film in each specimen cut to given dimensions was brought into contact with a silicon substrate to attach the specimen to the silicon substrate. Next, the specimen attached to the silicon substrate was set in a holder and placed in the high-resolution Rutherford backscattering spectrometer. Then, the inside of the high-resolution Rutherford backscattering spectrometer was evacuated to vacuum in the order of $10^{-8}$ Torr. The specimen was irradiated with an ion beam to obtain a high resolution RBS spectrum. The ion beam irradiation conditions were adjusted as follows.

Incident ion: $He^+$
Incident energy: 450 keV
Incident angle: 45 degrees or 28.5 degrees
Scattering angle: 90 degrees or 123 degrees
Specimen current: 10 nA
Irradiation amount: 12.5 μC or 18.75 μC High-resolution hydrogen forward scattering spectroscopy (HFS) was performed in the same manner as for high resolution RBS to obtain high-resolution HFS spectra, except that the ion beam irradiation conditions were changed as follows.

Incident ion: $Ne^+$
Incident energy: 480 keV
Incident angle: 70 degrees
Scattering angles: 30 degrees
Specimen current: about 2 nA
Irradiation amount: about 0.4 μC A system background largely attributed to a dark current of a detector was subtracted from each of the obtained high-resolution RBS spectra, and then simulation fitting was performed. Moreover, a system background largely attributed to a dark current of a detector was subtracted from each of the obtained high-resolution HFS spectra, and then simulation fitting was performed. From the simulation fitting results was determined the ratio of the number of hydrogen atoms to the total number of indium atoms, tin atoms, oxygen atoms, and hydrogen atoms. The results are shown in Table 1.

[X-Ray Diffraction]

The thickness was measured for resistive layers of the resistive layer-attached films according to Examples and Comparative Example by X-ray reflectivity using an X-ray diffractometer (manufactured by Rigaku Corporation, product name: RINT2200). The results are shown in Table 1. Additionally, the resistive layer-attached films according to Examples and Comparative Example were subjected to annealing at 150° C. and for 1 hour, and X-ray diffraction patterns of the resistive layers having undergone the annealing were obtained using an X-ray diffractometer. A Cu-Kα radiation was used as the X-ray. Whether the resistive layers were in an amorphous state or a polycrystalline state was confirmed from the obtained X-ray diffraction patterns. The results are shown in Table 1.

[Durability Test]

Radio wave absorbers according to Examples and Comparative Example were stored in an environment at 85° C. and a relative humidity of 85% for 500 hours. After that, each of the radio wave absorbers was measured for the return loss (the absolute value of the ratio, expressed in dB, of the electric power of a reflected wave to the electric power of an incident wave) using a 76-GHz millimeter wave vertically incident thereon according to JIS R 1679: 2007. The term "return loss" herein corresponds to "reflection amount" in JIS R 1679: 2007. For each of Examples and Comparative Example, the return loss was measured for five samples. From the average of the measured return loss values, the return loss of each of the radio wave absorbers according to Examples and Comparative Example having undergone the durability test was evaluated according to the following criteria. The results are shown in Table 1.

AA: The average return loss is 30 dB or more.
A: The average return loss is 20 dB or more and less than 30 dB.
B: The average return loss is 10 dB or more and less than 20 dB.
X: The average return loss is less than 10 dB.

[Hall Mobility]

Hall effect measurement was performed for the resistive layer-attached films according to Examples and Comparative Example according to the van der Pauw method using a Hall effect measurement system (manufactured by Nanometrics Incorporated, product name: HL5500PC). From the results of the Hall effect measurement, Hall mobilities of the resistive layers of the radio wave absorbers according to Examples and Comparative Example were determined. The results are shown in Table 1.

Example 1

To form a resistive layer having a sheet resistance of 400Ω/□ on a PET film (manufactured by Mitsubishi Chemical Corporation, product name: DIAFOIL), sputtering was performed using an ITO including 10 weight % of $SnO_2$ as a target material while water was introduced so that the ratio of the number of hydrogen atoms to the total number of indium atoms, tin atoms, oxygen atoms, and hydrogen atoms would be 5% in the resistive layer. A resistive layer-attached film according to Example 1 was obtained in this manner. An ITO film was formed on another PET film (manufactured by Mitsubishi Chemical Corporation, product name: DIAFOIL) by sputtering using an ITO including 10 weight % of $SnO_2$ as a target material. After that, the ITO film was subjected to annealing treatment at 150° C. for 1 hour to turn the ITO into a polycrystalline structure and form an electrical conductor having a sheet resistance of 20Ω/□. An electrical conductor attached film was obtained in this manner. A resin composition including ethylene-vinyl acetate copolymer (EVA) was pressed to a given thickness to obtain an EVA layer. The EVA layer had a relative permittivity of 2.45. The EVA layer was placed on the electrical conductor-attached film according to Example 1 to be in contact with the PET film of the electrical conductor-attached film according to Example 1, and the resistive layer-attached film according to Example 1 was placed on the EVA layer in such a manner that the PET film of the resistive layer-attached film according to Example 1 was in contact with the EVA layer. A radio wave absorber according to Example 1 was obtained in this manner.

Example 2

A resistive layer-attached film according to Example 2 was produced in the same manner as in Example 1, except for the following. The amount of water introduced during sputtering was adjusted so that the ratio of the number of hydrogen atoms to the total number of indium atoms, tin atoms, oxygen atoms, and hydrogen atoms would be 10% in the resistive layer. A radio wave absorber according to Example 2 was produced in the same manner as in Example 1, except that a resistive layer-attached film according to Example 2 was used instead of the resistive layer-attached film according to Example 1.

Example 3

A resistive layer-attached film according to Example 3 was produced in the same manner as in Example 1, except for the following. The amount of water introduced during sputtering was adjusted so that the ratio of the number of hydrogen atoms to the total number of indium atoms, tin atoms, oxygen atoms, and hydrogen atoms would be 15% in the resistive layer. A radio wave absorber according to Example 3 was produced in the same manner as in Example 1, except that the resistive layer attached film according to Example 3 was used instead of the resistive layer-attached film according to Example 1.

Example 4

A resistive layer-attached film according to Example 4 was produced in the same manner as in Example 1, except for the following. An ITO including 3 weight % of $SnO_2$ was used as a target material instead of the ITO including 10 weight % of $SnO_2$. The amount of water introduced during sputtering was adjusted so that the ratio of the number of hydrogen atoms to the total number of indium atoms, tin atoms, oxygen atoms, and hydrogen atoms would be 10% in the resistive layer. A radio wave absorber according to Example 4 was produced in the same manner as in Example 1, except that the resistive layer-attached film according to Example 4 was used instead of the resistive layer-attached film according to Example 1.

Example 5

A resistive layer-attached film according to Example 5 was produced in the same manner as in Example 1, except for the following. An ITO including 5 weight % of $SnO_2$ was used as a target material instead of the ITO including 10 weight % of $SnO_2$. The amount of water introduced during sputtering was adjusted so that the ratio of the number of hydrogen atoms to the total number of indium atoms, tin atoms, oxygen atoms, and hydrogen atoms would be 10% in the resistive layer. A radio wave absorber according to Example 5 was produced in the same manner as in Example 1, except that the resistive layer-attached film according to Example 5 was used instead of the resistive layer-attached film according to Example 1.

Example 6

A resistive layer-attached film according to Example 6 was produced in the same manner as in Example 1, except for the following. An ITO including 15 weight % of SnO$_2$ was used as a target material instead of the ITO including 10 weight % of SnO$_2$. The amount of water introduced during sputtering was adjusted so that the ratio of the number of hydrogen atoms to the total number of indium atoms, tin atoms, oxygen atoms, and hydrogen atoms would be 10% in the resistive layer. A radio wave absorber according to Example 6 was produced in the same manner as in Example 1, except that the resistive layer-attached film according to Example 6 was used instead of the resistive layer-attached film according to Example 1.

Example 7

A resistive layer-attached film according to Example 7 was produced in the same manner as in Example 1, except for the following. An ITO including 18 weight % of SnO$_2$ was used as a target material instead of the ITO including 10 weight % of SnO$_2$. The amount of water introduced during sputtering was adjusted so that the ratio of the number of hydrogen atoms to the total number of indium atoms, tin atoms, oxygen atoms, and hydrogen atoms would be 10% in the resistive layer. A radio wave absorber according to Example 7 was produced in the same manner as in Example 1, except that the resistive layer-attached film according to Example 7 was used instead of the resistive layer attached film according to Example 1.

Example 8

A resistive layer-attached film according to Example 8 was produced in the same manner as in Example 1, except for the following. The sputtering conditions were adjusted so that the resistive layer would have a sheet resistance of 200Ω/□. The amount of water introduced during sputtering was adjusted so that the ratio of the number of hydrogen atoms to the total number of indium atoms, tin atoms, oxygen atoms, and hydrogen atoms would be 10% in the resistive layer. A radio wave absorber according to Example 8 was produced in the same manner as in Example 1, except that the resistive layer-attached film according to Example 8 was used instead of the resistive layer-attached film according to Example 1.

Example 9

A resistive layer-attached film according to Example 9 was produced in the same manner as in Example 1, except for the following. The sputtering conditions were adjusted so that the resistive layer would have a sheet resistance of 550Ω/□. The amount of water introduced during sputtering was adjusted so that the ratio of the number of hydrogen atoms to the total number of indium atoms, tin atoms, oxygen atoms, and hydrogen atoms would be 10% in the resistive layer. A radio wave absorber according to Example 9 was produced in the same manner as in Example 1, except that the resistive layer-attached film according to Example 9 was used instead of the resistive layer-attached film according to Example 1.

Comparative Example 1

A resistive layer-attached film according to Comparative Example 1 was produced in the same manner as in Example 1, except for the following. The amount of water introduced during sputtering was adjusted so that the ratio of the number of hydrogen atoms to the total number of indium atoms, tin atoms, oxygen atoms, and hydrogen atoms would be 4% in the resistive layer. A radio wave absorber according to Comparative Example 1 was produced in the same manner as in Example 1, except that the resistive layer-attached film according to Comparative Example 1 was used instead of the resistive layer attached film according to Example 1.

As shown in Table 1, although the content of tin oxide in the indium tin oxide in the resistive layer was less than 20 weight %, the radio wave absorbers according to Examples 1 to 9 had higher durability than that of the radio wave absorber according to Comparative Example 1. It is thought that because the ratio of the number of hydrogen atoms to the total number of indium atoms, tin atoms, oxygen atoms, and hydrogen atoms was 5% or more in the resistive layers of the radio wave absorbers according to Examples 1 to 9, the resistive layers were able to stably maintain their amorphous state.

TABLE 1

| | Resistive layer | | | | | | |
|---|---|---|---|---|---|---|---|
| | Ratio of number of hydrogen atoms to total number of indium atoms, tin atoms, oxygen atoms, and hydrogen atoms [%] | Concentration of SnO$_2$ in ITO [weight %] | Thickness [nm] | Sheet resistance [Ω/□] | Hall mobility [cm$^2$/(V · s)] | Structure after annealing at 150° C. for 1 hour | Result of durability test |
| Example 1 | 5 | 10 | 20 | 400 | 33 | Amorphous | AA |
| Example 2 | 10 | 10 | 20 | 400 | 31 | Amorphous | AA |
| Example 3 | 15 | 10 | 20 | 400 | 29 | Amorphous | AA |
| Example 4 | 10 | 3 | 20 | 400 | 26 | Amorphous | B |
| Example 5 | 10 | 5 | 20 | 400 | 28 | Amorphous | A |
| Example 6 | 10 | 15 | 20 | 400 | 33 | Amorphous | AA |
| Example 7 | 10 | 18 | 20 | 400 | 35 | Amorphous | AA |
| Example 8 | 10 | 10 | 20 | 200 | 38 | Amorphous | B |
| Example 9 | 10 | 10 | 20 | 550 | 20 | Amorphous | B |
| Comparative Example 1 | 4 | 10 | 20 | 400 | 45 | Polycrystalline | X |

The invention claimed is:

1. A radio wave absorber comprising:
   a resistive layer comprising indium tin oxide as a main component;
   an electrical conductor that reflects a radio wave; and
   a dielectric layer disposed between the resistive layer and the electrical conductor in the thickness direction of the resistive layer and formed of a polymer, wherein
   the content of tin oxide in the indium tin oxide is more than 0 weight % and less than 20 weight %, and
   the number of hydrogen atoms comprised in the resistive layer is 5% or more of the total number of indium atoms, tin atoms, oxygen atoms, and hydrogen atoms comprised in the resistive layer.

2. The radio wave absorber according to claim 1, wherein the resistive layer remains in an amorphous state after the resistive layer is subjected to annealing at 150° C. and for 1 hour.

3. The radio wave absorber according to claim 1, wherein the resistive layer comprises at least one selected from the group consisting of silicon oxide, magnesium oxide, and zinc oxide.

4. The radio wave absorber according to claim 1, wherein the electrical conductor comprises indium tin oxide.

5. The radio wave absorber according to claim 1, wherein the electrical conductor comprises at least one selected from the group consisting of aluminum, copper, an aluminum alloy, and a copper alloy.

6. The radio wave absorber according to claim 1, wherein the resistive layer has a sheet resistance of 180 to 600 $\Omega/\square$.

7. The radio wave absorber according to claim 1, wherein the resistive layer has a thickness of 18 to 100 nm.

8. The radio wave absorber according to claim 1, wherein the resistive layer has a Hall mobility of less than 40 cm$^2$/(V·s).

9. The radio wave absorber according to claim 1, wherein the dielectric layer has a relative permittivity of 2.0 to 20.0.

10. The radio wave absorber according to claim 1, wherein the dielectric layer comprises at least one polymer selected from the group consisting of ethylene-vinyl acetate copolymer, vinyl chloride resin, urethane resin, acrylic resin, acrylic urethane resin, polyethylene, silicone, and polyethylene terephthalate.

11. The radio wave absorber according to claim 1, further comprising an adhesive layer, wherein
    the electrical conductor is disposed between the dielectric layer and the adhesive layer.

12. The radio wave absorber according to claim 1, further comprising an adhesive layer, wherein
    the adhesive layer is disposed between the dielectric layer and the electrical conductor.

13. The radio wave absorber according to claim 1, wherein the dielectric layer adheres to the electrical conductor.

14. A laminate for radio wave absorbers comprising:
    a resistive layer comprising indium tin oxide as a main component; and
    a dielectric layer disposed in contact with the resistive layer in the thickness direction of the resistive layer and formed of a polymer, wherein
    the content of tin oxide in the indium tin oxide is more than 0 weight % and less than 20 weight %, and
    the number of hydrogen atoms comprised in the resistive layer is 5% or more of the total number of indium atoms, tin atoms, oxygen atoms, and hydrogen atoms comprised in the resistive layer.

* * * * *